(12) United States Patent
Watanabe et al.

(10) Patent No.: US 7,879,956 B2
(45) Date of Patent: *Feb. 1, 2011

(54) CIRCUIT-CONNECTING MATERIAL AND CIRCUIT TERMINAL CONNECTED STRUCTURE AND CONNECTING METHOD

(75) Inventors: Itsuo Watanabe, Ibaraki-ken (JP);
Tohru Fujinawa, Ibaraki-ken (JP);
Motohiro Arifuku, Saitama-ken (JP);
Houko Kanazawa, Ibaraki-ken (JP);
Atsushi Kuwano, Ibaraki-ken (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/841,532

(22) Filed: Aug. 20, 2007

(65) Prior Publication Data

US 2008/0054225 A1    Mar. 6, 2008

Related U.S. Application Data

(62) Division of application No. 11/227,186, filed on Sep. 16, 2005, now Pat. No. 7,618,713, which is a division of application No. 10/860,578, filed on Jun. 4, 2004, now Pat. No. 7,629,056, which is a division of application No. 09/402,274, filed as application No. PCT/JP98/01467 on Mar. 31, 1998, now Pat. No. 6,777,464.

(30) Foreign Application Priority Data

Mar. 31, 1997 (JP) .................................. 9-079422
Mar. 31, 1997 (JP) .................................. 9-079424
Sep. 18, 1997 (JP) .................................. 9-252933

(51) Int. Cl.
*C08L 15/00* (2006.01)
*C08L 63/00* (2006.01)
*C09J 115/00* (2006.01)
*C09J 163/00* (2006.01)
*B32B 25/00* (2006.01)
*B32B 27/38* (2006.01)

(52) U.S. Cl. .................... 525/526; 156/330; 156/330.9; 156/331.1; 523/400; 525/529; 525/533; 428/413

(58) Field of Classification Search ........................ None
See application file for complete search history.

(56) References Cited

U.S. PATENT DOCUMENTS

| | | | |
|---|---|---|---|
| 4,212,959 A * | 7/1980 | Fukami et al. ............... 525/524 |
| 4,243,462 A | 1/1981 | Hori et al. | |
| 4,607,087 A | 8/1986 | Moriya et al. | |
| 4,735,847 A | 4/1988 | Fujiwara et al. | |
| 4,735,988 A | 4/1988 | Takada et al. | |
| 4,963,974 A | 10/1990 | Ushio et al. | |
| 5,001,542 A * | 3/1991 | Tsukagoshi et al. ......... 257/746 |
| 5,096,962 A | 3/1992 | Holmes-Farley et al. | |
| 5,120,665 A | 6/1992 | Tsukagoshi | |
| 5,158,818 A | 10/1992 | Aurichio | |
| 5,162,087 A | 11/1992 | Fukuzawa et al. | |
| 5,183,969 A | 2/1993 | Odashima | |
| 5,208,266 A | 5/1993 | Yamazaki | |
| 5,395,876 A | 3/1995 | Frentzel et al. | |
| 5,475,048 A | 12/1995 | Jamison et al. | |
| 6,097,100 A | 8/2000 | Eguchi et al. | |
| 6,124,023 A | 9/2000 | Furuta et al. | |
| 6,762,249 B1 | 7/2004 | Fujinawa et al. | |
| 6,777,464 B1 | 8/2004 | Watanabe et al. | |
| 6,939,913 B1 | 9/2005 | Arifuku et al. | |
| 7,141,645 B2 | 11/2006 | Fujinawa et al. | |
| 7,241,644 B2 | 7/2007 | Arifuku et al. | |
| 7,553,890 B2 | 6/2009 | Watanabe et al. | |
| 7,604,868 B2 | 10/2009 | Watanabe et al. | |
| 7,618,713 B2 | 11/2009 | Watanabe et al. | |
| 7,629,050 B2 | 12/2009 | Watanabe et al. | |
| 7,629,056 B2 | 12/2009 | Watanabe et al. | |
| 7,776,438 B2 | 8/2010 | Tatsuzawa et al. | |
| 7,777,335 B2 | 8/2010 | Arifuku et al. | |
| 7,785,708 B2 | 8/2010 | Tatsuzawa et al. | |
| 2004/0222408 A1 | 11/2004 | Watanabe et al. | |
| 2005/0151271 A1 | 7/2005 | Tatsuzawa et al. | |

(Continued)

FOREIGN PATENT DOCUMENTS

EP    0 372 880    6/1990

(Continued)

OTHER PUBLICATIONS

Machine Translation of JP 09-176309, provided by the JPO website (1997).*
Machine translation of JP 05-339556, provided by the JPO website (1993).*
Office Action in the corresponding U.S. Appl. No. 10/860,578, issued on Nov. 27, 2007.
Office Action Issued in the Corresponding U.S. Appl. No. 11/841,422 dated Jan. 9, 2008.
Office Action Issued in the Corresponding U.S. Appl. No. 11/227,186 Dated Jan. 2, 2008.
Osswald et al., Material Science of Polymers for Engineers, 1996, pp. 23-37.
Non Final Office Action Issued in the Corresponding U.S. Appl. No. 10/860,578 on Apr. 9, 2008.

(Continued)

*Primary Examiner*—Michael J Feely
(74) *Attorney, Agent, or Firm*—Griffin & Szipl, P.C.

(57) ABSTRACT

A circuit-connecting material for interposing between circuit electrodes facing each other and electrically connecting the electrodes, after curing by heat and pressure, either by direct contact or via conductive particles present in the material. The circuit-connecting material features the following essential components: (1) a curing agent capable of generating free radicals upon heating, (2) a phenoxy resin having a weight average molecular weight of 10,000 or more, and that is chemically modified by a carboxyl-group-containing elastomer, and (3) a radical-polymerizable substance.

18 Claims, 1 Drawing Sheet

U.S. PATENT DOCUMENTS

| | | | |
|---|---|---|---|
| 2005/0176882 A1 | 8/2005 | Arifuku et al. |
| 2006/0014860 A1 | 1/2006 | Watanabe et al. |
| 2006/0060969 A1 | 3/2006 | Watanabe et al. |
| 2006/0063366 A1 | 3/2006 | Watanabe et al. |
| 2006/0100314 A1 | 5/2006 | Arifuku et al. |
| 2006/0252843 A1 | 11/2006 | Fujinawa et al. |
| 2007/0299172 A1 | 12/2007 | Watanabe et al. |
| 2008/0054225 A1 | 3/2008 | Watanabe et al. |
| 2008/0057742 A1 | 3/2008 | Watanabe et al. |
| 2008/0064233 A1 | 3/2008 | Watanabe et al. |
| 2008/0064849 A1 | 3/2008 | Tatsuzawa et al. |
| 2010/0012358 A1 | 1/2010 | Tatsuzawa et al. |

FOREIGN PATENT DOCUMENTS

| | | | |
|---|---|---|---|
| EP | 0 488 561 A1 | | 6/1992 |
| EP | 0 995 784 | | 4/2000 |
| JP | 50-126954 | | 10/1975 |
| JP | 51-20941 | | 2/1976 |
| JP | 52-090537 | | 7/1977 |
| JP | 59-159866 | | 9/1981 |
| JP | 59-120436 | | 7/1984 |
| JP | 59-204613 | | 11/1984 |
| JP | 59-221371 | | 12/1984 |
| JP | 60-191228 | | 9/1985 |
| JP | 60-262430 | | 12/1985 |
| JP | 61-148277 | | 7/1986 |
| JP | 61-194732 | | 8/1986 |
| JP | 61-296077 | | 12/1986 |
| JP | 62-141083 | | 6/1987 |
| JP | 63-081187 | | 4/1988 |
| JP | 63-083181 | | 4/1988 |
| JP | 1-251787 | | 10/1989 |
| JP | 3-29207 | | 2/1991 |
| JP | 03-137121 | | 6/1991 |
| JP | 4-174980 | | 6/1992 |
| JP | 04-216884 | | 8/1992 |
| JP | 04-275380 | | 9/1992 |
| JP | 04-277585 | | 10/1992 |
| JP | 05-339555 | | 12/1993 |
| JP | 05-339556 | | 12/1993 |
| JP | 05-347464 | | 12/1993 |
| JP | 06-059268 | | 4/1994 |
| JP | 6-145639 | | 5/1994 |
| JP | 06-295617 | | 10/1994 |
| JP | 07-073740 | | 3/1995 |
| JP | 07-090236 | | 4/1995 |
| JP | 7-90237 | | 4/1995 |
| JP | 7-211145 | | 8/1995 |
| JP | 07-326635 | | 12/1995 |
| JP | 8-73832 | | 3/1996 |
| JP | 08-111124 | * | 4/1996 |
| JP | 08-239641 | | 9/1996 |
| JP | 08-239642 | | 9/1996 |
| JP | 08-253739 | | 10/1996 |
| JP | 08-315885 | | 11/1996 |
| JP | 08-319461 | | 12/1996 |
| JP | 08-325543 | | 12/1996 |
| JP | 09-025394 | | 1/1997 |
| JP | 9-55448 | | 2/1997 |
| JP | 09-095652 | | 4/1997 |
| JP | 09-118860 | | 5/1997 |
| JP | 09-169958 | | 6/1997 |
| JP | 09-176309 | * | 7/1997 |
| JP | 09-291259 | | 11/1997 |
| JP | 10-273626 | | 10/1998 |
| JP | 10-273630 | | 10/1998 |
| JP | 10-330616 | | 12/1998 |
| JP | 11-065112 | | 3/1999 |
| JP | 11-065130 | | 3/1999 |
| JP | 11-87415 | | 3/1999 |
| JP | 11-279511 | | 10/1999 |
| JP | 11-279513 | | 10/1999 |
| JP | 11-329069 | | 11/1999 |
| JP | 3048197 | | 3/2000 |
| JP | 2001-068832 | | 3/2001 |
| JP | 2001-323249 | | 11/2001 |
| JP | 2002-285135 | | 10/2002 |
| JP | 2003-027035 | | 1/2003 |
| JP | 3477367 | | 9/2003 |
| JP | 2004-128465 | | 4/2004 |
| JP | 3587859 B2 | | 11/2004 |
| JP | 3877090 | | 11/2006 |
| WO | 98/44067 | | 10/1998 |
| WO | 01/14484 A1 | | 3/2001 |

OTHER PUBLICATIONS

Calder et al., "Ask a Scientist: Molecular Size and Solubility", 2002, http://www.newton.dep.anl.gov/askasci/chem00/chem00888.htm.
Office Action issued in related U.S. Appl. No. 11/227,186, dated Aug. 25, 2008.
Office Action issued in related U.S. Appl. No. 11/227,231, dated Sep. 24, 2008.
Office Action issued in related U.S. Appl. No. 11/227,212, dated Sep. 24, 2008.
Japanese Office Action issued in corresponding application No. 2005-116147 issued Sep. 9, 2008.
Kirak, Arzu et al., "Dielectric properties and electric conductivity of talc and doped talc," J. Phys. D: Appl Phys. 32, 1999, pp. 1919-1927.
Office Action issued in a counterpart European patent application No. 06115661.8, dated Oct. 8, 2008.
Office Action issued in a counterpart U.S. Appl. No. 10/860,578, dated Oct. 17, 2008.
Office Action issued in a counterpart U.S. Appl. No. 11/841,483, dated Dec. 24, 2008.
Japanese Office Action issued in related application No. P2003-186397, mailed Jun. 19, 2007, and English translation thereof.
Office Action issued in co-pending U.S. Appl. No. 11/227,212 on Jan. 10, 2008.
Office Action issued in related Japanese application 2005-116151, dated Dec. 1, 2009. No English translation available, submitted for certification date purposes.
Japanese Office Action mailed Oct. 21, 2008 in Application No. P2005-116155.
Japanese Office Action mailed Dec. 2, 2008 in Application No. P2003-186397.
Japanese Office Action mailed Mar. 24, 2009 in Application No. P2005-116151.
Examiner's Interview Summary, dated Jan. 7, 2009 in U.S. Appl. No. 11/227,186 previously fied and labeled as "Exhibit A".
Search Report issued in corresponding European Application No. 06115661.8, completed Sep. 8, 2006 and mailed Sep. 20, 2006.
"Chemical Dictionary," Morikita Publish. Inc., pp. 833-834, 1986.
Observations by Third Parties Under EPC Art. 115, 23 pages.
English translations of JP 08-325543, prepared by the Japanese Patent Office, 2003, 12 pages.
ACS English Abstracts for JP 11-279511 and JP 11-279513, 2002.
European Search Report in EP 98 91 1125, May 22, 2000, 4 pages.
European Search Report in EP 04 02 8659, Mar. 30, 2005, 3 pages.
Machine translation of JP 08-111124, provided by the JPO website.
Machine translation of JP 08-325543, provided by the JPO website.
Machine translation of JP 08-319461, provided by the JPO website.
English translation of the International Preliminary Report on Patentability in related application No. PCT/JP2007/065376, mailed Mar. 12, 2009.
Extended/Supplementary European Search Report issued in a related European application. 07792046.0, completed Jul. 27, 2010 and mailed Aug. 5, 2010.
Office Action issued in co-pending related U.S. Appl. No. 11/227,231, mailed Nov. 2, 2010.

* cited by examiner

| | |
|---|---|
| 1 | SUBSTRATE |
| 1-a | CIRCUIT ELECTRODE |
| 2 | SUBSTRATE |
| 2-a | CIRCUIT ELECTRODE |
| 3 | ADHESIVE |
| 4 | CONDUCTIVE PARTICLE |
| 5 | HOT PLATE |

CIRCUIT-CONNECTING MATERIAL AND CIRCUIT TERMINAL CONNECTED STRUCTURE AND CONNECTING METHOD

This application is a divisional of U.S. patent application Ser. No. 11/227,186 (Now U.S. Pat. No. 7,618,713) filed Sep. 16, 2005, which is a divisional of U.S. patent application Ser. No. 10/860,578 (Now U.S. Pat. No. 7,629,056) filed Jun. 4, 2004, which is a divisional of U.S. patent application Ser. No. 09/402,274 (Now U.S. Pat. No. 6,777,464) filed Dec. 16, 1999, which is a National Phase Application of PCT/JP98/01467 filed Mar. 31, 1998, which claims priority from Japanese Patent Application No. 09-079422, filed Mar. 31, 1997, Japanese Patent Application No. 09-079424, filed Mar. 31, 1997, and Japanese Patent Application No. 09-252933, filed Sep. 18, 1997, the entire disclosures of the above patent applications are hereby incorporated by reference.

TECHNICAL FIELD

This invention relates to a circuit-connecting material to be interposed between circuit electrodes facing each other and, the facing electrodes being pressed against each other, to electrically connect the electrodes in the pressing direction. It also relates to a circuit terminal connected structure and a circuit terminal connecting method.

BACKGROUND ART

Epoxy resin adhesives are widely used for various purposes of electric, electronic, construction, automobile, aircraft and so forth because they can attain a high bonding strength and have excellent water resistance and heat resistance. In particular, one-part epoxy resin adhesives are used in the form of films, pastes or powders because they make it unnecessary to mix the base resin and the curing agent and can be used with ease. In this case, it is general to attain specific performances by using epoxy resins, curing agents and modifiers in various combinations (e.g., Japanese Patent Application Laid-open (KOKAI) No. 62-141083).

However, film type epoxy resin adhesives as disclosed in the above Japanese Patent Application Laid-open (KOKAI) No. 62-141083, though having an excellent operability, have been required to be heated at about 140 to 180° C. when connected in a time of about 20 seconds, and at about 180 to 210° C. when connected in 10 seconds.

This is because catalyst type curing agents, which are inert at normal temperature, are used so that both short-time curability (rapid curability) and storage stability (storability) can be achieved to attain a better stability, and hence no sufficient reaction can take place when cured.

In recent years, in the field of precision electronic equipment, circuits are being made higher in density, resulting in very small width of electrodes and very narrow spaces between electrodes. Hence, there has been a problem that the wiring comes off, separates or positionally deviates under connecting conditions for circuit-connecting materials making use of conventional epoxy resin adhesives. Also, in order to improve production efficiency, it is increasingly sought to shorten the connecting time to 10 seconds or less, making it indispensable to attain low-temperature rapid curability.

DISCLOSURE OF THE INVENTION

The present invention provides an electric and electronic circuit-connecting material having a superior low-temperature rapid curability and also having a long pot life.

A first circuit-connecting material of the present invention is a circuit-connecting material which is interposed between circuit electrodes facing each other and electrically connects the electrodes in the pressing direction by pressing the facing electrodes against each other;

the circuit-connecting material comprising as essential components the following components (1) to (3):
(1) a curing agent capable of generating free radicals upon heating;
(2) a hydroxyl-group-containing resin having a molecular weight of 10,000 or more; and
(3) a radical-polymerizable substance.

As the curing agent capable of generating free radicals upon heating, preferred are curing agents having a 10-hour half-life temperature of 40° C. or above and a 1-minute half-life temperature of 180° C. or below, and peroxy esters are usable.

The radical-polymerizable substance may contain a radical-polymerizable substance represented by the following chemical formula (a).

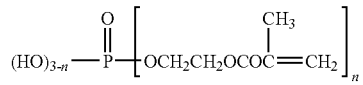

wherein n is an integer of 1 to 3.

As the hydroxyl-group-containing resin having a molecular weight of 10,000 or more, preferred are phenoxy resins, in particular, phenoxy resins modified with a carboxyl-group-containing elastomer and phenoxy resins modified with an epoxy-group-containing elastomer.

A second circuit-connecting material of the present invention is a circuit-connecting material which is interposed between circuit electrodes facing each other and electrically connects the electrodes in the pressing direction by pressing the facing electrodes against each other;

the circuit-connecting material comprising as essential components the following components (3) and (4):
(3) a curing agent capable of generating free radicals upon heating and having a 10-hour half-life temperature of 40° C. or above and a 1-minute half-life temperature of 180° C. or below; and
(4) a radical-polymerizable substance.

As the curing agent capable of generating free radicals upon heating, peroxyesters are preferred.

The circuit-connecting material described above may contain an acrylic rubber.

A third circuit-connecting material of the present invention is a circuit-connecting material which is interposed between circuit electrodes facing each other and electrically connects the electrodes in the pressing direction by pressing the facing electrodes against each other;

the circuit-connecting material having, in the measurement with a differential scanning calorimeter (DSC) at 10° C./min., an exothermic reaction arising temperature (Ta) within a range of from 70° C. to 110° C., a peak temperature (Tp) of Ta+5 to 30° C. and an end temperature (Te) of 160° C. or below.

The above circuit-connecting material may contain conductive particles.

The circuit terminal connected structure of the present invention comprises a first circuit member having a first connecting terminal and a second circuit member having a second connecting terminal;

the circuit members being disposed in such a way that the first connecting terminal and the second connecting terminal face each other; the circuit-connecting material described above being interposed between the first connecting terminal and the second connecting terminal which face each other; and the first connecting terminal and the second connecting terminal which face each other being electrically connected.

The circuit terminal connecting method of the present invention comprises;

disposing a first circuit member having a first connecting terminal and a second circuit member having a second connecting terminal, in such a way that the first connecting terminal and the second connecting terminal face each other and interposing the circuit-connecting material described above, between the first connecting terminal and the second connecting terminal which face each other, followed by heating and pressing to electrically connect the first connecting terminal and the second connecting terminal which face each other.

The circuit terminal connected structure of the present invention may also comprise a first circuit member having a first connecting terminal and a second circuit member having a second connecting terminal;

the circuit members being disposed in such a way that the first connecting terminal and the second connecting terminal face each other; a circuit-connecting material capable of curing upon radical polymerization being interposed between the first connecting terminal and the second connecting terminal which face each other; the surface of at least one of the first and second connecting terminals being formed of a metal selected from gold, silver, tin and platinum group metals; and the first connecting terminal and the second connecting terminal which face each other being electrically connected.

The circuit terminal connecting method of the present invention may also comprise;

disposing a first circuit member having a first connecting terminal and a second circuit member having a second connecting terminal, in such a way that the first connecting terminal and the second connecting terminal face each other and interposing a circuit-connecting material capable of curing upon radical polymerization, between the first connecting terminal and the second connecting terminal which face each other, followed by heating and pressing to electrically connect the first connecting terminal and the second connecting terminal which face each other;

the surface of at least one of the first and second connecting terminals being formed of a metal selected from gold, silver, tin and platinum group metals; and the circuit-connecting material capable of curing upon radical polymerization being formed on one connecting terminal whose surface is formed of the metal selected from gold, silver, tin and platinum group metals, and thereafter the other connecting terminal being registered, followed by the heating and pressing to connect them.

BEST MODE FOR PRACTICING THE INVENTION

Figure 1:
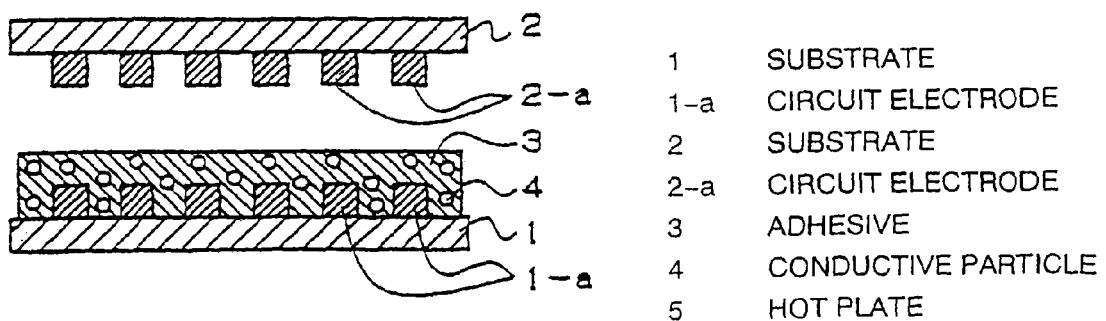
FIG. 1 is a cross-sectional view showing the step of provisional connection of circuit substrates, illustrating an embodiment of the present invention.

The curing agent capable of generating free radicals upon heating, used in the present invention, may include peroxide compounds and azo compounds which are capable of being decomposed to generate free radicals upon heating, and may appropriately be selected in accordance with the intended connecting temperature, connecting time, pot life or the like. In view of high reactivity and pot life, organic peroxides having a 10-hour half-life temperature of 40° C. or above and a 1-minute half-life temperature of 180° C. or below are preferred, and organic peroxides having a 10-hour half-life temperature of 60° C. or above and a 1-minute half-life temperature of 170° C. or below are more preferred.

The curing agent may preferably be mixed in an amount of from 0.05 to 10 parts by weight, and more preferably from 0.1 to 5 parts by weight, based on 100 parts by weight of the total weight of the hydroxyl-group-containing resin having a molecular weight of 10,000 or more and radical-polymerizable substance.

The curing agent may be selected from diacyl peroxides, peroxydicarbonates, peroxyesters, peroxyketals, dialkyl peroxides, hydroperoxides and silyl peroxides. In order to keep connecting terminals of the circuit member from corrosion, chloride ions or organic acids contained in the curing agent may preferably be in an amount of 5,000 ppm or less. Curing agents that may generate less organic acids after heating and decomposition are more preferred.

Stated specifically, the curing agent may preferably be selected from peroxyesters, dialkyl peroxides, hydroperoxides and silyl peroxide, and may more preferably be selected from peroxyesters with which high reactivity can be obtained.

These curing agents may be used in an appropriate combination.

As the peroxyesters, usable are cumyl peroxyneodecanoate, 1,1,3,3-tetramethylbutyl peroxyneodecanoate, 1-cyclohexyl-1-methyethyl peroxynoedecanoate, t-hexyl peroxyneodecanoate, t-butyl peroxypivarate, 1,1,3,3-tetramethylbutyl peroxy-2-ethylhexanoate, 2,5-dimethyl-2,5-di(2-ethylhexanoylperoxy)hexane, 1-cyclohexyl-1-methyethyl peroxy-2-ethylhexanoate, t-hexyl peroxy-2-ethylhexanoate, t-butyl peroxy-2-ethylhexanoate, t-butyl peroxyisobutyrate, 1,1-bis(t-butylperoxy)cyclohexane, t-hexyl peroxyisopropylmonocarbonate, t-butyl peroxy-3,5,5-trimethylhexanoate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, t-butyl peroxyacetate and the like.

As the dialkyl peroxides, α,α'-bis(t-butylperoxy)diisopropylbenzene, dicumyl peroxide, 2,5-dimethyl-2,5-di(t-butylperoxy)hexane, t-butylcumyl peroxide and the like may be used.

As the hydroperoxides, diisopropylbenzene hydroperoxide, cumene hydroperoxide and the like may be used.

As the diacyl peroxides, isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoyl peroxytoluene, benzoyl peroxide and the like may be used.

As the peroxydicarbonates, di-n-propyl peroxydicarbonate, diisopropyl peroxydicarbonate, bis(4-t-butylcyclohexyl) peroxydicarbonate, di(2-ethoxyethyl) peroxydicarbonate, di(2-ethylhexyl)peroxydicarbonate, di(3-methoxybutyl) peroxydicarbonate, di(3-methyl-3-methoxybutyl) peroxydicarbonate and the like may be used.

As the peroxyketals, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclododecane, 2,2-bis(t-butylperoxy)decane and the like may be used.

As the silyl peroxides, t-butyltrimethylsilyl peroxide, bis (t-butyl)dimethylsilyl peroxide, t-butyltrivinylsilyl peroxide, bis(t-butyl)divinylsilyl peroxide, tris(t-butyl)vinylsilyl peroxide, t-butyltriallylsilyl peroxide, bis(t-butyl)diallylsilyl peroxide, tris(t-butyl)allylsilyl peroxide and the like may be used.

Any of these curing agents capable of generating free radicals may be used alone or in combination, and a decomposition accelerator or inhibitor may be used in combination.

These curing agents may also be coated with a polymeric substance of polyurethane type or polyester type so as to be made into microcapsules. Such curing agents are preferred because their pot life can be made longer.

The radical-polymerizable substance used in the present invention is a substance having a functional group capable of undergoing radical polymerization, and may include acrylates, methacrylates, maleimide compounds and the like. The radical-polymerizable substance may be used in the state of either of a monomer and an oligomer. Such monomer and oligomer may also be used in combination.

As specific examples of the acrylates (methacrylates inclusive), they include methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3 -diacryloxypropane, 2,2-bis[4-(acryloxymethoxy)phenyl]propane, 2,2-bis[4-(acryloxypolyethoxy)phenyl]propane, dicyclopentenyl acrylate, tricyclodecanyl acrylate, tris(acryloyloxyethyl) isocyanurate and the like. Any of these may be used alone or in combination. If necessary, a polymerization inhibitor such as hydroquinones and methyl ether hydroquinones may appropriately be used. Also, an instance where the radical-polymerizable substance has a dicyclopentenyl group and/or a tricyclodecanyl group and/or a triazine ring is preferred because heat resistance is improved.

The maleimide compounds may include those having at least two maleimide groups in the molecule, as exemplified by 1-methyl-2,4-bismaleimide benzene, N,N'-m-phenylenebismaleimide, N,N'-p-phenylenebismaleimide, N,N'-m-toluylenebismaleimide, N,N'-4,4-biphenylenebismaleimide, N,N'-4,4-(3,3'-dimethyl-biphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenyl sulfone bismaleimide. 2,2-bis[4-(4-maleimidophenoxy)phenyl]propane, 2,2-bis[3-s-butyl-4-(4-maleimidophenoxy)phenyl]propane, 1,1-bis[4-(4-maleimidophenoxy)phenyl]decane, 4,4'-cyclohexylidene-bis[1 -(4-male imidophenoxy)-2-cyclo hexylbenzene and 2,2-bis[4-(4-maleimidophenoxy)phenyl] hexafluoropropane. Any of these may be used alone or in combination.

Use of the above radical-polymerizable substance in combination with a radical-polymerizable substance having the phosphate structure represented by the above chemical formula (a) brings about an improvement in bonding strength on the surface of an inorganic matter such as metal. The radical-polymerizable substance may preferably be mixed in an amount of from 0.1 to 10 parts by weight, and more preferably from 0.5 to 5 parts by weight, based on 100 parts by weight of the total weight of the hydroxyl-group-containing resin having a molecular weight of 10,000 or more and radical-polymerizable substance.

The radical-polymerizable substance having the phosphate structure can be obtained as a reaction product of phosphoric anhydride with 2-hydroxyethyl acrylate or methacrylate. Stated specifically, it may include mono(2-methacryloyloxyethyl) acid phosphate and di(2-methacryloyloxyethyl) acid phosphate or the like. Any of these may be used alone or in combination.

As the hydroxyl-group-containing resin having a molecular weight of 10,000 or more, polymers such as polyvinyl butyral, polyvinyl formal, polyamide, polyester, phenol resin, epoxy resin and phenoxy resin may be used, which exhibit superior stress relaxation properties at the time of curing and bring about an improvement in adhesion attributable to hydroxyl groups. Those obtained by modifying any of these polymers with radical-polymerizable functional groups are more preferred because heat resistance is improved. In such an instance, they are hydroxyl-group-containing resins having a molecular weight of 10,000 or more and also radical-polymerizable substances.

These polymers may preferably have a molecular weight of 10,000 or more, but those having a molecular weight of 1,000,000 or more tend to have poor mixing properties.

As the hydroxyl-group-containing resin having a molecular weight of 10,000 or more, a hydroxyl-group-containing resin having a Tg (glass transition temperature) of 40° C. or above and having a molecular weight of 10,000 or more may be used, and phenoxy resin may be used. The hydroxyl-group-containing resin having a molecular weight of 10,000 or more may be modified with a carboxyl-group-containing elastomer, an epoxy-group-containing elastomer or a radical-polymerizable functional group. Those modified with the radical-polymerizable functional group are preferred because heat resistance is improved.

The phenoxy resin is a resin obtained by allowing a bifunctional phenol to react with an epihalohydrin to have a high molecular weight, or subjecting a bifunctional epoxy resin and a bifunctional phenol to polyaddition reaction. Stated specifically, it can be obtained by allowing 1 mole of a bifunctional phenol to react with 0.985 to 1.015 mole of an epihalohydrin in the presence of an alkali metal hydroxide, in a non-reactive solvent and at a temperature of from 40 to 120° C.

In view of mechanical properties and thermal properties of the resin, particularly preferred is a resin obtained using a bifunctional epoxy resin and a bifunctional phenol which are mixed in an equivalent weight ratio of epoxy group/phenolic hydroxyl group=1/0.9 to 1/1.1, and by subjecting them to polyaddition reaction in the presence of a catalyst such as an alkali metal compound, an organic phosphorus compound or a cyclic amine compound, in an organic solvent having a boiling point of 120° C. or above of such as amides, ethers, ketones, lactones or alcohols, and at a reaction solid matter concentration of 50% by weight or less while heating the system to 50 to 200° C.

The bifunctional epoxy resin may include bisphenol-A epoxy resin, bisphenol-F epoxy resin, bisphenol-AD epoxy resin, bisphenol-S epoxy resin, and alkylene oxide addition products, halides (such as tetrabromophenol epoxy resin) or hydrogenation products of these, as well as alicyclic epoxy resins, aliphatic chain epoxy resins and halides or hydrogenation products of these.

These compounds may have any molecular weight. Especially when reacted with the bifunctional phenol, those having a purity as high as possible are preferred. These compounds may be used in combination of some kinds.

The epihalohydrin may include epichlorohydrin, epibromohydrin and epiiodohydrin.

The bifunctional phenol may be any phenols so long as they are compounds having two phenolic hydroxyl groups, as exemplified by monocyclic bifunctional phenols such as hydroquinone, 2-bromohydroquinone, resorcinol and catechol, bisphenols such as bisphenol A, bisphenol F, bisphenol AD and bisphenol S, dihydroxybiphenyls such as 4,4'-dihydroxybiphenyl, dihydroxyphenyl ethers such as bis(4-hydroxyphenyl) ether, and any of these compounds into the aromatic ring of the phenolic skeleton of which a straight-chain alkyl group, a branched alkyl group, an aryl group, a methylol group, an allyl group, a cyclic aliphatic group, a halogen atom (to form, e.g., tetrabromobisphenol A), a nitro group or the like has been introduced, and also polycyclic bifunctional phenols formed by introducing a straight-chain alkyl group, a branched alkyl group, an allyl group, an ally group with a substituent, a cyclic aliphatic group or an alkoxycarbonyl group into the carbon atom present at the center of the bisphenolic skeleton of any of these compounds.

Stated specifically, the bifunctional phenol may include 4,4'-(1-methylethylidene)bis[2-methylphenol], 4,4'-methylenebis[2-methylphenol], 4,4'-(1-methylethylidene)bis[2-(1-methylethyl)phenol], 4,4'-(1-methylethylidene)bis[2-(1,1-methylpropyl)phenol], 4,4'-(1-methylethylidene)bis[2-(1,1-dimethylethyl)phenol], tetramethylbisphenol A, tetramethylbisphenol F, 4,4'-methylenebis[2,6-bis(1,1-dimethylethyl)phenol], 4,4'-(1-methylethylidene)bis[2,6-di(1,1-dimethylethyl) phenol], 4,4'-(1-methylethylidene)bis[2-(2-propenyl)phenol], 4,4'-methylenebis[2-(2-propenyl(phenol), 4,4'-(1-methylethylidene)bis[2-(1-phenylethyl)phenol], 3,3'-dimethyl[1,1'-biphenyl]-4,4'-diol, 3,3',5,5'-tetramethyl[1,1'-biphenyl]-4,4'-diol, 3,3',5,5'-tetra-t-butyl[1,1'-biphenyl]-4, 4'-diol, 3,3'-bis(2-propenyl)-[1,1'-biphenyl]-4,4'-diol, 4,4'-(1-methylethylidene)bis[2-methyl-6-hydroxymethylphenol], tetramethylolbisphenol A, 3,3',5,5'-tetrakis(hydroxymethyl)-(1,1'-biphenyl)-4,4'diol, 4,4'-(1-methylethylidene)bis[2-phenylphenol], 4,4'-(1-methylethylidene)bis[2-cyclohexylphenol], 4,4'-methylenebis(2-cyclohexyl-5-methylphenol), 4,4'-(1-methylpropylidene)bisphenol, 4,4'-(1-methylheptylidene) bisphenol, 4,4'-(1-methyloctylidene)bisphenol, 4,4'-(1,3-dimethylbutylidene)bisphenol, 4,4'-(2-ethylhexylidene) bisphenol, 4,4'-(2-methylpropylidene)bisphenol, 4,4'-propylidenebisphenol, 4,4'-(1-ethylpropylidene)bisphenol, 4,4'-(3-methylbutylidene)bisphenol, 4,4'-(1-phenylethylidene)bisphenol, 4,4'-(phenylmethylene)bisphenol, 4,4'-(diphenylmethylene)bisphenol, 4,4'-[1-(4-nitrophenyl)ethylidene]bisphenol, 4,4'-[1-(4-aminophenyl)ethylidene] bisphenol, 4,4'-(4-bromophenyl)methylenebisphenol, 4,4'-(4-chlorophenyl)methylenebisphenol, 4,4'-(4-fluorophenyl) methylenebisphenol, 4,4'-(2-methylpropylidene)bis[3-methyl-6-(1,1-dimethylethyl)phenol], 4,4'-(1-ethylpropylidene)bis[2-methylphenol], 4,4'-(1-phenylethylidene)bis[2-methylphenol], 4,4'-(phenylmethylene)bis(2,3,5-trimethylphenol), 4,4'-(phenylethylidene)bis[2-(1,1-dimethylethyl)phenol], 4,4'-(1-methylpropylidene)bis[2-cyclohexyl-5-methylphenol], 4,4'-(1-phenylethylidene)bis[2-phenylphenol], 4,4'-butylidenebis[3-methyl-6-(1,1-dimethylethyl)phenol], 4-hydroxy-α-(4-hydroxyphenyl)-α-methylbenzene acetic acid methyl ester, 4-hydroxy-α-(4-hydroxyphenyl)-α-methylbenzene acetic acid ethyl ester, 4-hydroxy-α-(4-hydroxyphenyl) benzene acetic acid butyl ester, tetrabromobisphenol A, tetrabromobisphenol F, tetrabromobisphenol AD, 4,4'-(1-methylethylene)bis[2,6-dichlorophenol], 4,4'-(1-methylethylidene)bis[2-chlorophenol], 4,4'-(1-methylethylidene)bis [2-chloro-6-methylphenol], 4,4'-methylenebis[2-fluorophenol], 4,4'-isopropylidenebis[2-fluorophenol], 3,3'-difluoro-[1,1'-diphenyl]-4,4'-diol, 3,3',5,5'-tetrafluoro-[1,1'-biphenyl]-4,4'-diol, 4,4'-(phenylmethylene)bis[2-fluorophenol], 4,4'-(4-fluorophenyl)methylenebis[2-fluorophenol], 4,4'-(phenylmethylene)bis[2,6-difluorophenol], 4,4'-(4-fluorophenyl)methylenebis[2,6-difluorophenol], 4,4'-(diphenylmethylene)bis [2-fluorophenol], 4,4'-(diphenylmethylene)bis[2,6-difluorophenol], 4,4'-(1-methylethylene)bis[2-nitrophenol] and the like.

The polycyclic bifunctional phenols other than these may include 1,4-naphthalene diol, 1,5-naphthalene diol, 1,6-naphthalene diol, 1,7-naphthalene diol, 2,7-naphthalene diol, 4,4'-dihydroxydiphenyl ether, bis(4-hydroxyphenyl) methanone, 4,4'-cyclohexylidenebisphenol, 4,4'-cyclohexylidenebis[2-methylphenol], 4,4'-cyclopentylidenebisphenol, 4,4'-cyclopentylidenebis[2-methylphenol], 4,4'-cyclohexylidenebis[2,6-dimethylphenol], 4,4'-cyclohexylidenebis[2-(1,1-dimethylethyl)phenol], 4,4'-cyclohexylidenebis[2-cyclohexylphenol], 4,4'-(1,2-ethanediyl)bisphenol, 4,4'-cyclohexylidenebis[2-phenylphenol], 4,4'-[1,4-phenylenebis (1-methylethylidene)]bis[2-methyl phenol], 4,4'-[1,3-phenylenebis(1-methylethylidene)]bisphenol, 4,4'-[1,4-phenylenebis(1-methylethylidene)]bisphenol, 4,4'-[1,4-phenylenebis(1-methylethylidene)]bis[2-methyl-6-hydroxymethylphenol], 4-{1-[4-(4-hydroxy-3-methylphenyl)-4-methylcyclohexyl]-1-methylethyl}-2-methylphenol, 4-{1-[4-(4-hydroxy-3,5-dimethylphenyl)-4-methylcyclohexyl]-1-methylethyl}-2,6-dimethylphenol, 4,4'-(1,2-ethanediyl)bis[2,6-di-(1,1-dimethylethyl)phenol], 4,4'-(dimethylsilylene)bisphenol, 1,3-bis(p-hydroxyphenyl)-1,1,3,3-tetramethyldisiloxane, silicone oligomers both-end terminated with p-hydroxyphenyl groups, and 2,2'-methylidenebisphenol, 2,2'-methylethylidenebisphenol, 2,2'-ethylidenebisphenol or the like into the aromatic ring of the phenolic skeleton of which a straight-chain alkyl group, a branched alkyl group, an aryl group, a methylol group or an allyl group has been introduced.

Stated specifically, the last-mentioned ones may include 2,2'-methylidenebis[4-methylphenol], 2,2'-ethylidenebis[4-methylphenol], 2,2'-methylidenebis[4,6-dimethylphenol], 2,2'-(1-methylethylidene)bis[4,6-dimethylphenol], 2,2'-(1-methylethylidene)bis[4-sec-butylphenol], 2,2'-methylidenebis[6-(1,1-dimethylethyl)-4-methylphenol], 2,2'-ethylidenebis[4,6-di(1,1-dimethylethyl)phenol], 2,2'-methylidenebis[4-nonylphenol], 2,2'-methylidenebis[3-methyl-4,6-di(1,1-dimethylethyl)phenol], 2,2'-(2-methylpropylidene)]bis[2,4-dimethylphenol], 2,2'-ethylidenebis[4-(1,1-dimethylethyl)phenol], 2,2'-methylidenebis[2,4-di(t-butyl)-5 -methylphenol], 2,2'-methylidenebis(4-phenylphenol), 2,2'-methylidenebis(4-methyl-6-hydroxymethylphenol), 2,2'-methylenebis[6-(2-propenyl)phenol] and the like. These compounds may be used in combination of some kinds.

Solution formed after the reaction is completed may be purified by reprecipitation using a bad solvent such as methanol to obtain the product as a solid phenoxy resin. The phenoxy resin thus produced may be used in combination of two or more.

To achieve the object of the present invention, the phenoxy resin may preferably be a resin comprised of a first constituent unit represented by the following Formula (I) and/or a second constituent unit represented by the following Formula (II) and containing at least one first constituent unit in the molecule. In a case where a copolymer having both the first constituent unit and the second constituent unit is used as the phenoxy resin, the phenoxy resin may preferably contain at least 10 mole % of the first constituent unit, and may more preferably in a copolymerization ratio of first constituent unit: second constituent unit=2:8 to 8:2. In a case where two or more types of phenoxy resins are used, at least one of them may preferably be comprised of the first constituent unit and/or the second constituent unit and contain at least one first constituent unit in the molecule.

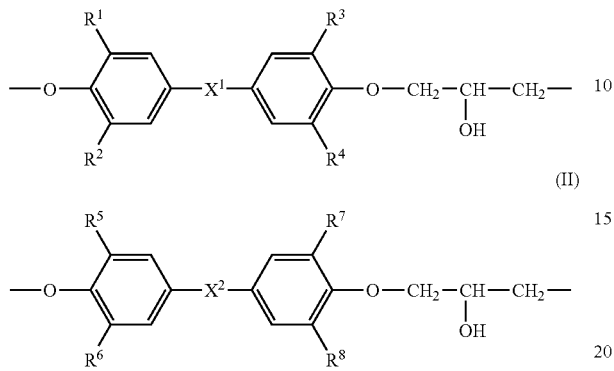

In the formulae, $R^1$ to $R^4$ are each independently selected from a hydrogen atom, an alkyl group having 1 to 4 carbon atoms (such as a methyl group, an ethyl group, a propyl group, a butyl group, an isopropyl group or an isobutyl group) and an electron-withdrawing group. At least one of $R^1$ to $R^4$ is an electron-withdrawing group. The electron-withdrawing group refers to a group whose Hammett's substituent constant σ has the positive value ("Chemical Dictionary", pp. 833-834, 1986, Morikita Publish. Inc.). It may include, e.g., halogens such as a fluorine atom, a chlorine atom and a bromine atom, a trifluoromethyl group, a trichloromethyl group, a tribromomethyl group, a nitro group, a nitrile group, alkoxyl groups such as a methoxyl group and an ethoxyl group, a carboxyl group, alkylcarbonyl groups such as a methylcarbonyl group and an ethylcarbonyl group, alkoxycarbonyl groups such as a methoxycarbonyl group and an ethoxycarbonyl group, and alkylsulfonyl groups. The halogens are preferred.

$R^5$ to $R^8$ are each independently selected from a hydrogen atom and an alkyl group having 1 to 4 carbon atoms (such as a methyl group, an ethyl group, a propyl group, a butyl group, an isopropyl group or an isobutyl group).

$X^1$ and $X^2$ each represent a divalent organic group or linkage. There are no particular limitations on the divalent organic group represented by $X^1$ and $X^2$. For example, it may include the following.

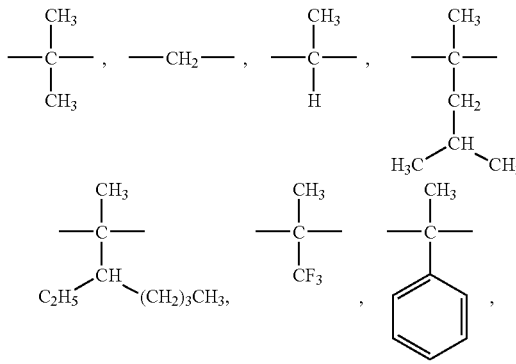

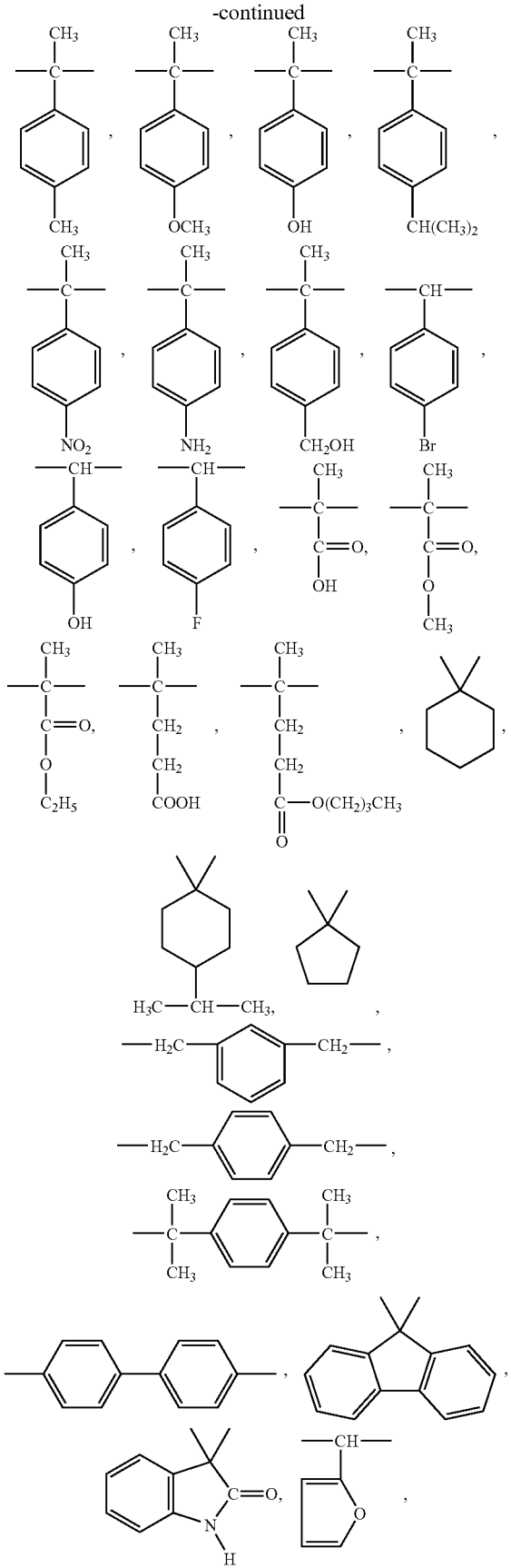

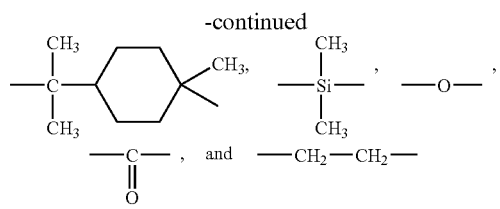

The phenoxy resin as described above can be obtained by using synthesis materials at least one of which is the bifunctional epoxy resin and/or bifunctional phenol which have a hydrogen atom, an alkyl group having 1 to 4 carbon atoms or an electron-withdrawing group.

As specific examples of such an phenoxy resin, it may include, e.g., a random copolymer comprised of a repeating unit represented by the following structural formula (III) and a repeating unit represented by the following structural formula (IV):

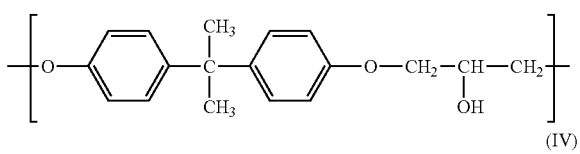

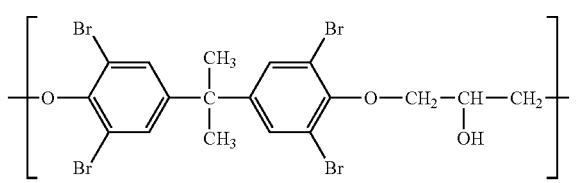

a polymer comprised of a repeating unit represented by the following structural formula (V):

a polymer comprised of a repeating unit represented by the following structural formula (VI):

a polymer comprised of a repeating unit represented by the following structural formula (VII):

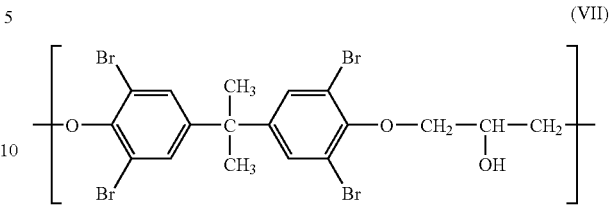

and the like.

In order for cured products to exhibit excellent properties such as flexibility, toughness and film-forming properties, a phenoxy resin is used which preferably has an average molecular weight (weight-average molecular weight in terms of polystyrene as measured by gel permeation chromatography) of at least 10,000, more preferably at least 20,000, and still more preferably at least 30,000. As commercially available products, it may include, e.g., PKHH and PAHJ (available from Union Carbide Corporation), YPB-43C, YPB-43D, YPB-43G, YPB-43m and YP-50 or YPB-40ASB25 and YPB-40AM40 (available from Tohto Kasei Co., Ltd.), which may be purified by reprecipitation.

The carboxyl-group-containing elastomer and the epoxy-group-containing elastomer may be any elastomers so long as they are those having a carboxyl group or epoxy group at the molecular terminal or in the molecular chain, including, e.g., butadiene copolymers, acrylic copolymers, polyether-urethane rubbers, polyester-urethane rubbers, polyamide-urethane rubbers and silicone rubbers. Butadiene type polymers are preferred. Incidentally, the butadiene type polymers may include butadiene polymer, butadiene-styrene copolymer, butadiene-acrylonitrile copolymer and the like. In particular, butadiene-acrylonitrile copolymer is preferred.

The carboxyl-group-containing elastomer may preferably have a weight-average molecular weight ranging from 500 to 1,000,000, more preferably from 1,000 to 800,000, and still more preferably from 1,000 to 10,000.

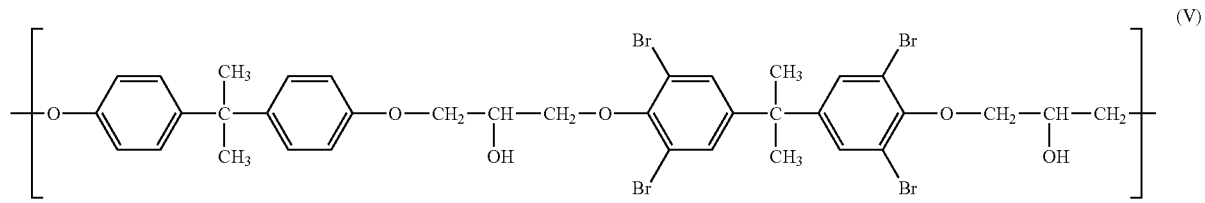

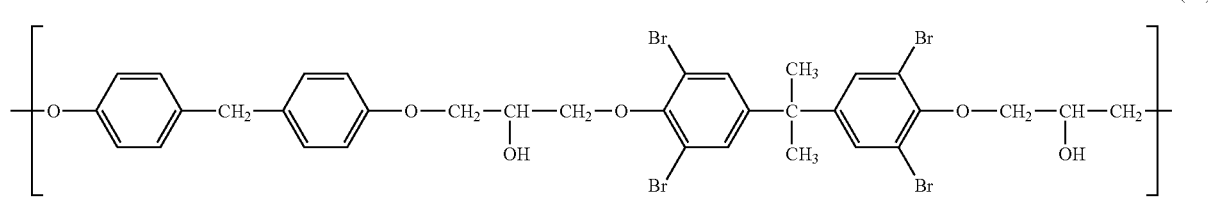

The quantity of a component compatible with the phenoxy resin contained in the elastomer skeleton may preferably be so determined that the phenoxy phase and the elastomer phase may be kept phase-separated, because the both may dissolve mutually if such a component is in a large quantity. The quantity of this component can be regulated as desired in accordance with the structure (SP value) of phenoxy resins and the heat resistance and mechanical strength of resins having been modified. For example, in the case of the butadiene-acrylonitrile copolymer, the content of the acrylonitrile may preferably be set to be not more than 40% by weight, more preferably from 5 to 40% by weight, and still more preferably from 10 to 30% by weight. As commercially available products, it may include, e.g., HYCAR CTBN1300×31, HYCAR CTBN1300×8, HYCAR CTBN1300×13, HYCAR CTBNX1300×9, HYCAR CTBNX1009-SP and HYCAR CTB200×162 (available from Ube Industries, Ltd.), NIPOL DN 601 (available from Nippon Zeon Co., Ltd.), Nisso PB C-1000, C-2000 (available from Nippon Soda Co., Ltd.), and ELC-4 (available from Japan Synthetic Rubber Co., Ltd.).

When the circuit connecting material of the present invention is used for electronic parts and devices such as semiconductors, ionic impurities in the material may preferably be made as less as possible. Accordingly, in these carboxyl-group-containing elastomers, too, alkali metal ions such as $Na^+$ and $K^+$ in the polymer may preferably be not more than 10 ppm, and more preferably not more than 5 ppm, and $Cl^-$ may preferably be not more than 400 ppm, more preferably not more than 100 ppm, and still more preferably not more than 40 ppm.

Such a phase-separated structural product of the present invention can be produced, e.g., in the following way.

First, the phenoxy resin is dissolved in a solvent, and the carboxyl-group-containing elastomer is dissolved in the resultant solution (the volume ratio of the phenoxy resin and the elastomer may be set as desired in accordance with the target values of flexibility, toughness and bonding strength of cured products, required in purposes for which the products are used, where the ratio of phenoxy resin: elastomer may preferably be in the range of from 60:40 to 90:10, and more preferably from 66:33 to 87:13).

The solvent used when produced may be any solvents so long as they are those capable of dissolving the phenoxy resin and carboxyl-group-containing elastomer. In an instance where a blocked isocyanate, described later, is added to the solution formed after heat-mixing, the solvent must be a solvent inert to isocyanate groups.

Next, the interior of the solution is well displaced with nitrogen, and thereafter the solution is mixed with stirring while heating it at about 100° C. to about 220° C., and preferably about 130° C. to about 180° C., in an atmosphere of nitrogen until the solution becomes semitransparent or transparent at normal temperature and preferably it comes to have a constant value of viscosity. The heat-mixing may preferably be carried out while refluxing the solvent.

The elastomer-modified phenoxy resin solution thus formed after the heat-mixing is completed may be purified by reprecipitation using a bad solvent such as methanol to obtain the product as a solid phase-separated structural product. The mechanism of such modification is unclear, but it has been ascertained that, in $^1$H-NMR spectra before and after modification, the integral value corresponding to protons of the methine bonded to the hydroxyl group in the phenoxy resin skeleton has decreased after modification. It has also been ascertained that, in FT-IR (Fourier-transform infrared absorption) spectra, remarkable changes have occurred in the spectra in the regions of from 3,460 $cm^{-1}$ to 3,560 $cm^{-1}$ and from 1,610 $cm^{-1}$ to 1,640 $cm^{-1}$ which are not seen in products obtained by merely blending elastomers. From these facts, it is presumed that at least part of carboxyl groups of the carboxyl-group-containing elastomer and at least part of hydroxyl groups of the phenoxy resin form an ester linkage.

In the elastomer-modified phenoxy resin which is obtained in this way, the phenoxy resin and the carboxyl-group-containing elastomer make up phase separation, and this phase-separated structural product alone can form an optically transparent or semitransparent film-like product. Such a film-like product, when formed in a layer thickness of 75 μm, may preferably have a light transmittance at 500 nm wavelength, of 10% or more with respect to the light transmittance of air. The light transmittance may more preferably be from 20 to 90%, and still more preferably from 30 to 85%.

Whether or not the phase separation has been made up can be ascertained by observation with a scanning or transmission electron microscope or an atomic force microscope or by dynamic viscoelasticity measurement, light scattering or small-angle X-ray scattering ("Polymer Blends", pp. 80-124, CMC Co. Ltd.). For example, in the dynamic viscoelasticity measurement, it may be ascertained by the phenomenon that the tanδ (loss elastic modulus G"/storage elastic modulus G') peak of principal dispersion of the elastomer phase and the tanδ peak of principal dispersion of the phenoxy resin phase are present independently.

The phase-separated structural product of the present invention may preferably have a microscopic phase-separated structure wherein, in a scanning electron microscope of the film-like product, the elastomer phase and the phenoxy resin phase are dispersed in the form of very small particles of submicroscopic order of about 0.1 to 0.3 μm. Such a film-like product of phase-separated structure stands optically transparent or semitransparent. More specifically, the light transmittance of the phase-separated structural product of the present invention, when formed in the film-like product with a layer thickness of 75 μm, is 10% or more with respect to the light transmittance of air.

The phase-separated structure of the elastomer-modified phenoxy resin obtained in the present invention may include, e.g., the microscopic phase-separated structure formed of the elastomer phase and phenoxy resin phase, and a microscopic phase-separated structure formed of microscopic domains connected with one another, which are structures hitherto unknown in the mixing of carboxyl-group-containing elastomers with phenoxy resins. Such a microscopic phase-separated structure is considered to be one factor that brings about an improvement in bonding strength to adherends.

The hydroxyl-group-containing resin having a molecular weight of 10,000 or more and the radical-polymerizable substance may preferably be formulated in such amounts of (hydroxyl-group-containing resin having a molecular weight of 10,000 or more/radical-polymerizable substance) of from 10/90 to 90/10, and more preferably from 30/70 to 70/30, in weight ratio.

In the circuit-connecting material of the present invention, a copolymer acrylic rubber which is a polymer or copolymer having as a monomer component at least one of acrylic acid, acrylate, methacrylate and acrylonitrile and contains glycidyl acrylate or glycidyl methacrylate containing a glycidyl ether group may also be used in combination. Such a material brings about superior stress relaxation, and is preferred. The acrylic rubber may preferably have a molecular weight (weight average) of 200,000 or more in view of an improvement of cohesive force of adhesives.

The circuit-connecting material may also contain a filler, a softener, an accelerator, an anti-aging agent, a colorant, a flame retardant, a thixotropic agent, a coupling agent and a phenol resin, as well as a melamine resin, a kind of isocyanates and the like.

The material containing a filler can improve connection reliability and so forth, and is preferred. The filler may be used so long as its maximum particle diameter is smaller than the particle diameter of the conductive particles, and may preferably be added in an amount ranging from 5 to 60 parts by volume based on 100 parts by volume of the adhesive resin component. Its addition in an amount more than 60 parts by volume may saturate the effect of improving reliability, and, in an amount less than 5 part by volume, may bring about less effect of addition.

As the coupling agent, those containing a vinyl group, an acrylic group, an amino group, an epoxy group or an isocyanate group are preferred in view of an improvement of adhesion.

The circuit-connecting material of the present invention is a connecting material which is interposed between circuit electrodes facing each other and electrically connects the electrodes in the pressing direction by pressing the facing electrodes against each other, wherein it has, in measurement with a differential scanning calorimeter (DSC) at 10° C./min., an exothermic reaction arising temperature (Ta) within a range of from 70° C. to 110° C., a peak temperature (Tp) of Ta+5 to 30° C. and an end temperature (Te) of 160° C. or below.

Conventional epoxy resin film-like adhesives, though having an excellent operability, have been required to be heated at about 140 to 180° C. when connected in a time of about 20 seconds, and at about 180 to 210° C. when connected in 10 seconds. This is because catalyst type curing agents, which are inert at normal temperature, are used so that both short-time curability (rapid curability) and storage stability (storability) can be achieved to attain a better stability, and hence no sufficient reaction can take place when cured. In recent years, in the field of precision electronic equipment, circuits are being made higher in density, resulting in very small width of electrodes and very narrow spaces between electrodes. Hence, there has been a problem that the wiring comes off, separates or positionally deviates under connecting conditions for circuit-connecting materials making use of conventional epoxy resin adhesives. Also, in order to improve production efficiency, it is increasingly sought to shorten the connecting time to 10 seconds or less, making it indispensable to attain low-temperature rapid curability.

The circuit-connecting material of the present invention can provide an electric and electronic circuit-connecting material which can cure upon heating at 140 to 180° C. for about 10 seconds to connect circuit electrodes, and also has a relatively long pot life at room temperature.

The circuit-connecting material of the present invention, even when it does not contain any conductive particles, can achieve connection by bringing the facing circuit electrodes into direct contact when connected, but stabler connection can be achieved in a case where it contains conductive particles.

The conductive particles may include particles of metals such as Au, Ag, Ni, Cu and solder or carbon. In order to attain a sufficient pot life, they may preferably have surface layers formed of not a transition metal such as Ni or Cu but a noble metal such as Au, Ag or a platinum group metal, and more preferably be formed of Au. Particles comprising a transition metal such as Ni and surface-coated with a noble metal such as Au may also be used. In a case of particles comprising non-conductive, glass or ceramic or plastic and on which the above conductive layers have been formed by coating to provide outermost layers of a noble metal and cores of plastic etc., or in a case of heat-fusion metal particles, the particles are deformable upon heating and pressing and hence can have a larger area of contact with electrodes at the time of connection, bringing about an improvement in reliability. Thus, such particles are preferred. Such coat layers of a noble metal may preferably be in a thickness of 100 Å or larger in order to attain a good resistance. However, in a case where layers of a noble metal are provided on particles of a transition metal such as Ni, it may preferably be in a thickness of 300 Å or larger, since free radicals generated by the redox action caused when, e.g., the noble-metal layers come off during the mixing and dispersion of conductive particles may cause a lowering of storage stability. The conductive particles are used properly in accordance with purposes, within the range of from 0.1 to 30 parts by volume based on 100 parts by volume of the adhesive resin component. In order to prevent adjoining circuits from short-circuiting because of any excess conductive particles, the conductive particles may more preferably be used within the range of from 0.1 to 10 parts by volume.

The circuit-connecting material may also be separated into two or more layers, and separated into a layer containing the curing agent capable of generating free radicals upon heating and a layer containing the conductive particles. In such an instance, it can be improved in pot life.

The circuit-connecting material of the present invention may also be used as a film-like adhesive for bonding IC chips to a chip-mounting substrate or for bonding electric circuits mutually.

The circuit-connecting material of the present invention may still also be used when semiconductor chips are bonded and fastened to a substrate with an adhesive film by face-down bonding and at the same time electrodes of the both are electrically connected to one another.

More specifically, a first circuit member having first connecting terminals and a second circuit member having second connecting terminals may be disposed in such a way that the first connecting terminals and the second connecting terminals face each other, and the circuit-connecting material (film-like adhesive) of the present invention may be interposed between the first connecting terminals and the second connecting terminals which face each other, followed by heating and pressing to electrically connect the first connecting terminals and the second connecting terminals which face each other.

As such circuit members, chip component parts such as semiconductor chips, resistor chips and capacitor chips and substrates such as printed-wiring substrates are used.

Usually, in these circuit members, a large number of connecting terminals (which may be in a singular number as occasion calls) are provided. At least one set of the circuit members are disposed in such a way that at least part of the connecting terminals provided on these circuit members face each other, and the adhesive is interposed between the connecting terminals facing each other, followed by heating and pressing to electrically connect the connecting terminals facing each other.

At least one set of the circuit members is heated and pressed, whereby the connecting terminals facing each other can electrically be connected in direct contact or via conductive particles of an anisotropic conductive adhesive.

In the circuit-connecting material of the present invention, the adhesive melt-flows at the time of connection and, after the circuit electrodes facing each other have been connected, cures to keep the connection, thus the fluidity of the adhesive is an important factor. Using glass sheets of 0.7 mm thick and 15 mm×15 mm in size and when a circuit-connecting material of 35 μm thick and 5 mm×5 mm in size is held between the glass sheets and these are heated and pressed at 150° C. and 2 MPa for 10 seconds, the value of fluidity (B)/(A) expressed on the basis of an initial area (A) and an area (B) after heating and pressing may preferably be from 1.3 to 3.0, and more preferably from 1.5 to 2.5. If the value is less than 1.3, the fluidity may be so poor as to enable no good connection in some cases. If it is more than 3.0, air bubbles tend to occur to make reliability poor in some cases.

The circuit-connecting material of the present invention may preferably have a modulus of elasticity of from 100 to 2,000 MPa, and more preferably from 1,000 to 1,800 MPa, at 40° C. after curing.

The circuit terminal connecting method of the present invention is characterized in that the circuit-connecting material capable of curing upon radical polymerization is formed on one circuit electrode whose surface is formed of a metal selected from gold, silver, tin and platinum group metals, and thereafter the other circuit electrode is registered, followed by heating and pressing to connect them.

The circuit electrode connected structure of the present invention is a circuit electrode connected structure wherein circuit electrodes facing each other is electrically connected via a circuit-connecting material, and is characterized in that the surface of at least one of the facing connecting terminals is formed of a metal selected from gold, silver, tin and platinum group metals and the circuit-connecting material is a circuit-connecting material capable of curing upon radical polymerization.

As the circuit-connecting material capable of curing upon radical polymerization, an anisotropic conductive adhesive containing conductive particles may be used. As the conductive particles of such an anisotropic conductive adhesive, conductive particles are used whose surfaces are formed of a noble metal selected from gold, silver and platinum group metals.

As a result of extensive studies on connecting methods of electrically connecting circuit electrodes facing each other by the use of adhesives capable of curing upon radical polymerization, good electrical connection can be attained when the surface of at least one of the facing connecting terminals is formed of gold, silver, a platinum group metal or tin, and a radical-polymerizable adhesive is laid and formed on that surface (provisional connection), followed by main connection.

Figure 2:
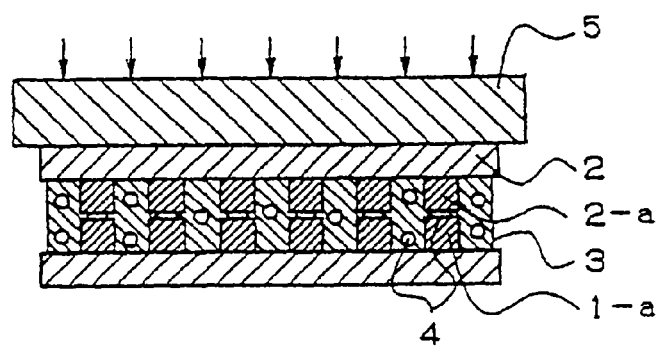
FIG. 2 is a cross-sectional view showing the step of main connection of circuit substrates, illustrating an embodiment of the present invention.

FIG. 1 is a cross-sectional view showing the step of provisional connection of circuit substrates, illustrating an embodiment of the present invention. FIG. 2 is a cross-sectional view showing the step of main connection of circuit substrates, illustrating an embodiment of the present invention. In these figures, reference numerals 1 and 2 denote substrates; 1-*a* and 2-*a*, circuit electrodes; 3, an adhesive; 4, conductive particles; and 5, a hot plate.

The substrate 1 used in the present invention is an insulating substrate made of silicon or gallium arsenic as in semiconductor chips, or glass, ceramic, a glass-epoxy composite or plastic, and the substrate 2 facing this substrate is also made of the similar material.

The circuit electrodes 1-*a* are provided on the surface of the substrate 1, using copper foil, and gold surface layers are formed thereon. The surface layers are formed of gold, silver, a platinum group metal or tin, any of which may be selected and any of which may be used in combination. Also, a plurality of metals may be combined in the manner of, e.g., copper/nickel/gold to provide multi-layer configuration. The circuit electrodes 2-*a* are provided on the surface of the substrate 2, using copper foil, and tin surface layers are formed thereon.

The substrates provided with the circuit electrodes may preferably previously be subjected to heat treatment before the step of connection carried out using the circuit-connecting material in order to eliminate the influence of the volatile component due to heating at the time of connection. The heat treatment may preferably be made under conditions of a temperature of 50° C. or above for 1 hour or longer, and more preferably a temperature of 100° C. or above for 5 hours or longer.

The adhesive 3 is an adhesive comprised essentially of the curing agent capable of generating free radicals upon heating and the radical-curable substance, or may be the radical-curable anisotropic conductive adhesive having conductive particles dispersed therein in a prescribed quantity. In the latter, the conductive particles may preferably have surfaces formed of a noble metal selected from gold, silver or a platinum group metal. The adhesive 3 is laid and formed (provisional connection) on the substrate 1.

As shown in FIG. 2, after the provisional connection, the circuit electrodes 1-*a* of the substrate 1 and the circuit electrodes 2-*a* of the substrate 2 are registered, and heat and pressure are applied from the upper part of the substrate 2 by means of the hot plate 5 for a prescribed time to complete the main connection.

When circuit electrodes are connected using a radical-curable adhesive having a good reactivity and using circuit electrodes whose surfaces are formed of transition metal such as nickel or copper, radical polymerization inevitably proceeds because of redox action after the radical-curable adhesive is laid and formed (provisional connection) on the circuit electrodes and thereafter left for a certain period of time, so that the adhesive may flow with difficulty to enable no sufficient electrical connection at the time of main connection. However, the present invention enables electric and electronic circuit connection promising a low-temperature curability superior to, and a longer pot life than, those of conventional epoxy resin types.

At least one of the substrates provided with the circuit electrodes may be subjected to heat treatment at a temperature of 50° C. or above for 1 hour or longer.

EXAMPLE 1

50 g of phenoxy resin (available from Union Carbide Corp.; trade name: PKHC; average molecular weight: 45,000) was dissolved in a 50/50 (weight ratio) mixed solvent of toluene (boiling point: 110.6° C.; SP value: 8.90) and ethyl acetate (boiling point: 77.1° C.; SP value: 9.10) to form a solution with a solid content of 40%.

As the radical-polymerizable substance, trihydroxyethyl glycol dimethacrylate (available from Kyoeisha Chemical Co., Ltd.; trade name: 80MFA) was used.

As the free-radical-generating agent, a 50% by weight DOP solution of t-hexylperoxy-2-ethyl hexanoate (available from Nippon Oil & Fats Co., Ltd.; trade name: PERCURE HO) was used.

On the surfaces of polystyrene-core particles, nickel layers of 0.2 μm thick were provided. On the outsides of the nickel layers formed, gold layers of 0.04 μm thick were provided. Thus, conductive particles of 10 μm in average particle diameter were produced.

The phenoxy resin, the trihydroxyethyl glycol dimethacrylate resin and the t-hexyl peroxy-2-ethylhexanoate were formulated in amounts of 50 g, 50 g and 5 g, respectively, in solid weight ratio, and the conductive particles were further mixed and dispersed in an amount of 3 parts by volume based on 100 parts by volume of the resin component. The resultant dispersion was coated on a one-side surface-treated PET film of 80 µm thick by means of a coater, followed by hot-air drying at 70° C. for 10 minutes to obtain a circuit-connecting material having an adhesive layer of 35 µm thick.

Using the above circuit-connecting material, flexible printed circuit boards (FPCs) each having 500 lines of copper circuits of 50 µm in line width, 100 µm pitch and 18 µm thick were connected to each other over a width of 2 mm while heating and pressing them at 160° C. and 3 MPa for 10 seconds. Here, the circuits were connected by putting the adhesive surface of the circuit-connecting material on the one FPC, followed by heating and pressing at 70° C. and 5 MPa for 5 seconds to make provisional connection, and thereafter peeling the PET film and connecting the one FPC to the other FPC.

EXAMPLES 2 TO 4

Circuit-connecting materials were obtained in the same manner as in Example 1 except that the trihydroxyethyl glycol dimethacrylate and a phosphate type acrylate (available from Kyoeisha Chemical Co., Ltd.; trade name: P2m) were used as radical-polymerizable substances and the solid weight ratio of the phenoxy resin/trihydroxyethyl glycol dimethacrylate/phosphate type acrylate was set to be 50 g/49 g/1 g (Example 2), 30 g/69 g/1 g (Example 3) or 70 g/29 g/1 g (Example 4).

Using these circuit-connecting materials, the circuits were connected in the same manner as in Example 1.

EXAMPLE 5

A circuit-connecting material was obtained in the same manner as in Example 1 except that the amount of the curing agent was changed to 2 g.

Using this circuit-connecting material, the circuits were connected in the same manner as in Example 1.

EXAMPLE 6

A circuit-connecting material was obtained in the same manner as in Example 1 except that the curing agent was changed to t-butyl peroxy-2-ethylhexanoate (available from Nippon Oil & Fats Co., Ltd.; trade name: PERBUTYL O).

Using this circuit-connecting material, the circuits were connected in the same manner as in Example 1.

EXAMPLE 7

100 g of phenoxy resin (PKHC) of 45,000 in average molecular weight was allowed to react with 25 g of a butadiene-acrylonitrile copolymer terminated with a carboxyl group (HYCAR CTBNX1009-SP, available from Ube Industries, Ltd.) by a conventional process to produce a phenoxy resin modified with the butadiene-acrylonitrile copolymer terminated with carboxyl groups. A circuit-connecting material was obtained in the same manner as in Example 1 except that this phenoxy resin was used and the solid weight ratio of the phenoxy resin/trihydroxyethyl glycol dimethacrylate/phosphate type acrylate was set to be 60 g/39 g/1 g.

Using this circuit-connecting material, the circuits were connected in the same manner as in Example 1.

EXAMPLE 8

100 g of phenoxy resin (PKHC) of 45,000 in average molecular weight was modified with 25 g of an epoxy-group-containing acrylic copolymer to produce a modified phenoxy resin. A circuit-connecting material was obtained in the same manner as in Example 1 except that this phenoxy resin was used and the solid weight ratio of the phenoxy resin/trihydroxyethyl glycol dimethacrylate/phosphate type acrylate was set to be 60 g/39 g/1 g.

Using this circuit-connecting material, the circuits were connected in the same manner as in Example 1.

EXAMPLE 9

A circuit-connecting material was obtained in the same manner as in Example 1 except that an epoxy-group-containing acrylic copolymer (acrylic rubber) was used and the solid weight ratio of the phenoxy resin/acrylic rubber/trihydroxyethyl glycol dimethacrylate/phosphate type acrylate was set to be 40 g/20 g/39 g/1 g.

Using this circuit-connecting material, the circuits were connected in the same manner as in Example 1.

EXAMPLE 10

100 g of phenoxy resin (PKHC) of 45,000 in average molecular weight was allowed to react with 5 g of a monoisocyanate terminated with an acrylic group, by a conventional process to produce a phenoxy resin modified with acrylic groups. A circuit-connecting material was obtained in the same manner as in Example 1 except that this phenoxy resin was used and the solid weight ratio of the phenoxy resin/trihydroxyethyl glycol dimethacrylate/phosphate type acrylate was set to be 60 g/39 g/1 g.

Using this circuit-connecting material, the circuits were connected in the same manner as in Example 1.

EXAMPLE 11

A circuit-connecting material was obtained in the same manner as in Example 1 except that Ni particles having an average particle diameter of 2 µm and surface-coated with Au (coating thickness: 0.08 µm) were used as the conductive particles and mixed in an amount of 0.5 parts by volume.

Using this circuit-connecting material, the circuits were connected in the same manner as in Example 1.

EXAMPLE 12

A circuit-connecting material was obtained in the same manner as in Example 1 except that the conductive particles were replaced with those having particle diameter of 5 µm.

Using this circuit-connecting material, the circuits were connected in the same manner as in Example 1.

EXAMPLE 13

A circuit-connecting material was obtained in the same manner as in Example 1 except that 2,2-bis{4-(acryloxy·diethoxy)phenyl}propane (available from Shin-Nakamura Chemical Co., Ltd.; trade name: A-BPE-4) was used as the radical-polymerizable substance and the solid weight ratio of the phenoxy resin/2,2-bis{4-(acryloxy·diethoxy)phenyl}propane/phosphate type acrylate was set to be 60 g/39 g/1 g.

Using this circuit-connecting material, the circuits were connected in the same manner as in Example 1.

EXAMPLE 14

A circuit-connecting material was obtained in the same manner as in Example 1 except that dicyclopentenyl acrylate (available from Kyoeisha Chemical Co., Ltd.; trade name: DCP-A) was used as the radical-polymerizable substance and the solid weight ratio of the phenoxy resin/dicyclopentenyl acrylate/phosphate type acrylate was set to be 60 g/39 g/1 g.

Using this circuit-connecting material, the circuits were connected in the same manner as in Example 1.

EXAMPLE 15

A circuit-connecting material was obtained in the same manner as in Example 1 except that tris(acryloyloxyethyl) isocyanurate was used as the radical-polymerizable substance and the solid weight ratio of the phenoxy resin/tris (acryloyloxyethyl)isocyanurate/phosphate type acrylate was set to be 60 g/39 g/1 g.

Using this circuit-connecting material, the circuits were connected in the same manner as in Example 1.

EXAMPLE 16

A mixture obtained by mixing 30 g of 4,4'-bismaleimide diphenylmethane and 35 g of diallylbisphenol A with heating at 120° C. for 20 minutes and a phosphate type acrylate (available from Kyoeisha Chemical Co., Ltd.; trade name: P-2m) were used as radical-polymerizable substances.

Phenoxy resin (PKHC) and nitrile rubber (available from Nippon Zeon Co., Ltd.; trade name: NIPOL 1072) were used in a ratio of phenoxy resin/nitrile rubber of 20 g/10 g, and were dissolved in 30 g of methyl ethyl ketone to prepare a solution with a solid content of 50%.

The mixture obtained by mixing 4,4'-bismaleimide diphenylmethane and diallylbisphenol A with heating at 120° C. for 20 minutes, the phenoxy resin, the nitrile rubber, the phosphate type acrylate and t-hexyl peroxy-2-ethylhexanoate were formulated in amounts of 69 g, 20 g, 10 g, 1 g and 5 g, respectively, in solid weight ratio, and conductive particles were further mixed and dispersed in an amount of 3 parts by volume. The subsequent procedure of Example 1 was repeated to obtain a circuit-connecting material.

Using this circuit-connecting material, the circuits were connected in the same manner as in Example 1.

EXAMPLE 17

A circuit-connecting material was obtained in the same manner as in Example 14 except that a mixture obtained by mixing 30 g of 4,4'-bismaleimide diphenylmethane and 20 g of diallylbisphenol A with heating at 120° C. for 20 minutes was used as the radical-polymerizable substance.

Using this circuit-connecting material, the circuits were connected in the same manner as in Example 1.

EXAMPLE 18

A circuit-connecting material was obtained in the same manner as in Example 1 except that Ni particles having an average particle diameter of 2 μm and surface-coated with Pd (coating thickness: 0.04 μm) were used as the conductive particles and mixed in an amount of 0.5% by volume.

Using this circuit-connecting material, the circuits were connected in the same manner as in Example 1.

COMPARATIVE EXAMPLE

A circuit-connecting material was obtained in the same manner as in Example 1 except that phenoxy resin (PKHC), bisphenol-A epoxy resin (YL980, trade name of a product of Yuka Shell Epoxy K.K.) and an imidazole type microcapsular curing agent (3941HP, trade name of a product of Asahi Chemical Industry Co., Ltd.) were used and the solid weight ratio of the phenoxy resin/bisphenol-A epoxy resin/imidazole type microcapsular curing agent was set to be 40 g/20 g/40 g.

(Measurement of Connection Resistance)

After the circuits were connected, the values of resistance between adjoining circuits of the FPCs having the above connected portion were measured at the initial stage and after keeping for 500 hours in a high-temperature high-humidity chamber of 85° C. and 85% RH. The resistance values were indicated as an average (x+3σ) of resistance at 150 spots between adjoining circuits. The circuit-connecting material obtained in Example 1 exhibited a good connection reliability. It was also in a low connection resistance at the initial stage and in an only slightly higher resistance after the high-temperature high-humidity test, showing a high durability. The same good reliability as that in Example 1 was also attained in Examples 2 to 18. On the other hand, in Comparative Example, the bonding was in a poor state because of an insufficient curing reaction, resulting in a high connection resistance at the initial stage.

(Measurement of Adhesive Force)

After the circuits were connected, adhesive force was measured by 90-degree peeling at a peel rate of 50 mm/minute. In Comparative Example, the curing reaction was so insufficient that the adhesive force was as low as about 200 gf/cm in bonding strength. In Examples 1 to 18, an adhesive force of as good as about 1,000 gf/cm was attained.

(Evaluation of Storage Stability)

The circuit-connecting materials obtained were treated for 30 days in a 30° C. thermostatic chamber, and the circuits were connected in the same manner as the above to evaluate their storage stability.

In all Examples, the results of connection were obtained which were the same as those in the state where the circuit-connecting materials were not treated for 30 days in a 30° C. thermostatic chamber (the initial stage).

(Evaluation of Insulating Properties)

Using the above circuit-connecting materials obtained, a printed-wiring substrate having comb circuits with alternately arranged 250 lines of copper circuits of 50 μm in line width, 100 μm pitch and 18 μm thick and a flexible printed circuit board (FPC) having 500 lines of copper circuits of 50 μm in line width, 100 μm pitch and 18 μm thick were connected to each other over a width of 2 mm while heating and pressing them at 160° C. and 3 MPa for 10 seconds. A voltage of 100 V was applied to the comb circuits of this connected structure to measure the value of insulation resistance after a 500-hour, 85° C./85% RH high-temperature high-humidity test.

In all Examples, good insulating properties of $10^9$ Ω or above were attained and any lowering of insulating properties was seen.

(Evaluation of Fluidity)

Using a circuit-connecting material of 35 μm thick and 5 mm×5 mm in size, this was held between glass sheets of 0.7 mm thick and 15 mm×15 mm in size and these were heated and pressed at 150° C. and 2 MPa for 10 seconds. The value of fluidity (B)/(A) expressed on the basis of an initial area (A) and an area (B) after heating and pressing was determined to find that it was 1.9 in Example 1, and also within the range of from 1.3 to 3.0 in Examples 2 to 10.

(Modulus of Elasticity After Curing)

The modulus of elasticity at 40° C. after curing was measured on the circuit-connecting material of Example 1 to find that it was 1,500 MPa.

(DSC Measurement)

On the circuit-connecting materials obtained, the exothermic reaction arising temperature (Ta), peak temperature (Tp) and end temperature (Te) were determined by means of a differential scanning calorimeter (DSC, manufactured by TA Instrument Co.; trade name: Model 910) in the measurement at 10° C./min.

In Example 1, the arising temperature (Ta) was 89° C., the peak temperature (Tp) was 103° C. and the end temperature (Te) was 145° C. In Example 2, the arising temperature (Ta) was 87° C., the peak temperature (Tp) was 99° C. and the end temperature (Te) was 140° C. In Example 7, the arising temperature (Ta) was 92° C., the peak temperature (Tp) was 116° C. and the end temperature (Te) was 150° C. In Comparative Example, the arising temperature (Ta) was 86° C., the peak temperature (Tp) was 121° C. and the end temperature (Te) was 180° C.

POSSIBILITY OF INDUSTRIAL APPLICATION

As described above, the present invention makes it possible to provide an electric and electronic circuit-connecting material having a low-temperature curability superior to, and a longer pot life than, those of conventional epoxy resin types.

What is claimed is:

1. A circuit-connecting material for interposing between circuit electrodes facing each other and electrically connecting the electrodes, after curing by heat and pressure, either by direct contact or via conductive particles present in the material, wherein the circuit-connecting material comprises:
   (1) a curing agent capable of generating free radicals upon heating;
   (2) a phenoxy resin having a weight average molecular weight of 10,000 or more, and that is chemically modified by a carboxyl-group-containing elastomer; and
   (3) a radical-polymerizable substance.

2. A circuit-connecting material as recited in claim 1, wherein the carboxyl-group-containing elastomer is selected from the group consisting of a butadiene copolymer, and acrylic copolymer, a polyether-urethane rubber, a polyester-urethane rubber, a polyamide-urethane rubber and a silicone rubber.

3. A circuit-connecting material as recited in claim 2, wherein the circuit-connecting material has a modulus of elasticity of from 100 to 2000 MPa at 40° C. after curing.

4. A circuit-connecting material as recited in claim 2, wherein the circuit-connecting material includes two or more layers, wherein a first layer contains conductive particles and a second layer contains the curing agent.

5. A circuit-connecting material as recited in claim 2, wherein the circuit-connecting material comprises conductive particles.

6. A circuit-connecting material as recited in claim 1, wherein the carboxyl-group-containing elastomer is a butadiene-acrylonitrile copolymer.

7. A circuit-connecting material as recited in claim 6, wherein the circuit-connecting material has a modulus of elasticity of from 100 to 2000 MPa at 40° C. after curing.

8. A circuit-connecting material as recited in claim 6, wherein the circuit-connecting material includes two or more layers, wherein a first layer contains conductive particles and a second layer contains the curing agent.

9. A circuit-connecting material as recited in claim 6, wherein the circuit-connecting material comprises conductive particles.

10. A circuit-connecting material as recited in claim 1, wherein the carboxyl-group-containing elastomer has a weight-average molecular weight ranging from 500 to 1,000,000.

11. A circuit-connecting material as recited in claim 10, wherein the circuit-connecting material has a modulus of elasticity of from 100 to 2000 MPa at 40° C. after curing.

12. A circuit-connecting material as recited in claim 10, wherein the circuit-connecting material includes two or more layers, wherein a first layer contains conductive particles and a second layer contains the curing agent.

13. A circuit-connecting material as recited in claim 10, wherein the circuit-connecting material comprises conductive particles.

14. A circuit-connecting material as recited in claim 1, wherein the circuit-connecting material includes two or more layers, wherein a first layer contains conductive particles and a second layer contains the curing agent.

15. A circuit-connecting material as recited in claim 1, wherein the circuit-connecting material comprises conductive particles.

16. A circuit-connecting material for interposing between circuit electrodes facing each other and electrically connecting the electrodes, after curing by heat and pressure, either by direct contact or via conductive particles present in the material, wherein the circuit-connecting material comprises:
   (1) a curing agent capable of generating free radicals upon heating;
   (2) a radical-polymerizable substance; and
   (3) a phenoxy resin having a weight average molecular weight of 10,000 or more, and that is chemically modified by a carboxyl-group-containing elastomer, wherein the circuit-connecting material has a modulus of elasticity of from 100 to 2000 MPa at 40° C. after curing.

17. A circuit-connecting material as recited in claim 16, wherein the circuit-connecting material includes two or more layers, wherein a first layer contains conductive particles and a second layer contains the curing agent.

18. A circuit-connecting material as recited in claim 16, wherein the circuit-connecting material comprises conductive particles.

* * * * *